(12) United States Patent
Calvas et al.

(10) Patent No.: US 11,250,306 B2
(45) Date of Patent: Feb. 15, 2022

(54) ELECTRONIC MODULE WITH OPTIMIZED ANTENNA FOR SMART CARDS WITH A DUAL COMMUNICATION INTERFACES

(71) Applicant: Smart Packaging Solutions, Rousset (FR)

(72) Inventors: Bernard Calvas, Rousset (FR); Guillaume Gerin, Rousset (FR); Kevin Fabrizio, Rousset (FR)

(73) Assignee: SMART PACKAGING SOLUTIONS, Rousset (FR)

(*) Notice: Subject to any disclaimer, the term of this patent is extended or adjusted under 35 U.S.C. 154(b) by 0 days.

(21) Appl. No.: 16/767,028

(22) PCT Filed: Nov. 20, 2018

(86) PCT No.: PCT/FR2018/000252
§ 371 (c)(1),
(2) Date: Aug. 27, 2020

(87) PCT Pub. No.: WO2019/102079
PCT Pub. Date: May 31, 2019

(65) Prior Publication Data
US 2020/0394484 A1 Dec. 17, 2020

(30) Foreign Application Priority Data
Nov. 24, 2017 (FR) ...................... 1701231

(51) Int. Cl.
*G06K 19/07* (2006.01)
*H01Q 7/00* (2006.01)
*H05K 1/02* (2006.01)

(52) U.S. Cl.
CPC ............... *G06K 19/07* (2013.01); *H01Q 7/00* (2013.01); *H05K 1/0243* (2013.01); *H05K 2201/10098* (2013.01)

(58) Field of Classification Search
CPC ........ G06K 19/07; H01Q 7/00; H05K 1/0243; H05K 2201/10098
(Continued)

(56) References Cited

U.S. PATENT DOCUMENTS 6,460,773 B1 * 10/2002 Kaiya .............. G06K 19/07745
235/492
2010/0038438 A1 * 2/2010 Kim ..................... G06K 19/077
235/492
(Continued)

FOREIGN PATENT DOCUMENTS

FR  2996944 A1  4/2014
FR  2998395 A1  5/2014

OTHER PUBLICATIONS

International Search Report (PCT/ISA/210) dated Feb. 15, 2019, by the European Patent Office as the International Searching Authority for International Application No. PCT/FR2018/000252.
(Continued)

*Primary Examiner* — Michael G Lee
*Assistant Examiner* — David Tardif
(74) *Attorney, Agent, or Firm* — Buchanan Ingersoll & Rooney PC

(57) ABSTRACT

An electronic module for a smart card has on a first face a terminal block of electrical contacts for contact with corresponding contacts of a card reader, and on a second face an antenna and a microelectronic chip within an encapsulation zone and provided with contact and contactless communication interfaces. The antenna has a plurality of turns at the periphery of the module and a proximal connection pad and a distal connection pad inside the encapsulation zone for connection to corresponding terminals of the contactless communication interface. The distal connection pad is located a short distance d from the edge of the encapsulation zone, and the internal edges of connection wells of the two
(Continued)

contacts closest to the distal connection pad are spaced outward from the module relative to the internal edges of the connection wells of the other contacts.

19 Claims, 4 Drawing Sheets

(58) Field of Classification Search
USPC .......................................................... 235/492
See application file for complete search history.

(56) References Cited

U.S. PATENT DOCUMENTS

| | | | | |
|---|---|---|---|---|
| 2010/0134362 | A1* | 6/2010 | Takasu | H01Q 7/00 343/702 |
| 2015/0269476 | A1* | 9/2015 | Calvas | G06K 19/07773 235/492 |
| 2015/0278675 | A1 | 10/2015 | Finn et al. | |
| 2016/0224975 | A1* | 8/2016 | Na | H04B 5/0031 |
| 2019/0164030 | A1* | 5/2019 | Lai | H05K 3/12 |

OTHER PUBLICATIONS

Written Opinion (PCT/ISA/237) dated Feb. 15, 2019, by the European Patent Office as the International Searching Authority for International Application No. PCT/FR2018/000252.

\* cited by examiner

ELECTRONIC MODULE WITH OPTIMIZED ANTENNA FOR SMART CARDS WITH A DUAL COMMUNICATION INTERFACES

The invention relates to an electronic module with a dual contact and contactless communication interface, and a smart card incorporating such a module.

STATE OF THE ART

In the state of the art there are already mixed contact and contactless smart cards. Most have a microelectronic module having on the one hand contacts standardized according to ISO 7816-2 and corresponding to the contacts of a smart card reader, and having on the other hand a radio frequency communication interface provided with at least an antenna and able to communicate with the antenna of a contactless reader.

When the smart card includes an antenna implemented in the card body, it is sometimes directly connected to the contactless interface of the microelectronic module, and this mechanical connection between the antenna and the module then induces losses of reliability or manufacturing efficiency. In fact, the mechanical and thermal stresses imposed on the card during its use can cause the connection between the module and the antenna to break, or cause significant increases of the electrical resistance of this connection, resulting in a loss of performance of the card during use.

This led to increased use of modules for smart cards with dual communication interface, comprising a small antenna located directly on the module, and a second larger antenna located in the card body, also called "booster" antenna, coupled with the module antenna but not physically connected to it.

In this case, in order to manufacture a smart card, it suffices to simply transfer the module with a dual communication interface into a smart card body, which is easy to achieve with low cost and high reliability with most conventional machines used for the manufacture of smart cards with contacts.

But new problems have emerged. Thus, the modules with double communication Interface having metal contacts on their upper face and a microelectronic chip as well as antenna tracks of the module located on their lower face, the electrical connection of the terminals of the chip with the contacts and the antenna required the production of metallized vias in order to realize an electrical connection between the faces of the module, resulting in relatively high production costs.

To remedy this problem, as shown for example in document FR 12 01866 A1, the two ends of the antenna of the module were moved inside the area of encapsulation of the chip, as shown in FIG. 1 of this application, which reproduces FIG. 7 of the aforementioned document.

In this way, the terminals of the chip could be connected both to the ISO contacts and to the terminals of the antenna of the module, inside the encapsulation cover of the chip, without the need for any vias.

However, to avoid crossings of wires and therefore short circuits, it was necessary to move the turns of the antenna of the module and to bring it partly into the encapsulation zone, in the form of a recess of the antenna turns bypassing the distal end of the antenna (i.e. the end of the outer turn of the module antenna), as can be seen in FIG. 1.

This arrangement was acceptable for large modules, of the so-called "DUAL8" type having a size of 11.8×13 mm², offering sufficient space for the displacement of the turns of the antenna.

Meanwhile, market demand has further evolved, in particular in the field of smart cards for banking applications, requiring the use of smaller dual interface communication modules, of the so-called "DUAL 6" type, having a size reduced to 8.3×11 mm²).

However, reducing the size of the modules implies in particular reducing the size of the turns of their antenna, and therefore, for the same number of turns, reducing the impedance L of the antenna, which results in the reduction of the product LC (C representing the capacity of the microelectronic chip), and the increase in the resonance frequency f of the module, equal to $1/(2\pi\sqrt{LC})$. This makes smart cards using such a module unfit to communicate with existing contactless readers at their nominal operating frequency.

To reduce the size of the module while keeping the normal resonant frequency, it is therefore necessary to increase the value of the impedance L of the antenna of the module, since it is not possible to intervene on the capacity C of the chips supplied by the chip manufacturers.

In order to substantially increase the value of the inductance L of the antenna of the module, while retaining its main design parameters (width of the antenna tracks, distance between tracks), it is necessary to extend the useful length of the antenna, by increasing the number of turns.

However, increasing the number of turns of the antenna of the module in a more restricted space due to the reduction in the size of the module, is a paradoxical task, and requires making certain changes in the design of the module, without giving up the advantages already obtained linked to the absence of vias.

OBJECTS OF THE INVENTION

A general aim of the invention is therefore to propose an electronic module with a dual contact and contactless communication interface, which is devoid of the aforementioned drawbacks linked to the reduction in the size of the modules.

A particular aim of the invention is to provide an electronic module for a smart card with a dual contact and contactless communication interface, having higher inductance values than in the prior art, to compensate for the reduction in the size of the modules, in particular the six-contact modules of dimensions 8.3×11 mm² used in banking applications.

Another particular aim of the invention is to propose an electronic module with a dual contact and contactless communication interface which makes it possible to present several inductance values of the antenna of the module, to adapt to different capacities of microelectronic chips available on the market, while retaining the advantages associated with a module antenna provided with a recess causing the turns of the antenna to bypass the distal end of the antenna.

SUMMARY OF THE INVENTION

According to its principle, the invention provides for increasing the space available for displacing the turns of the antenna, which must pass through a triangle located between the two connection wells of the two standardized contacts C1, C5 of the module, and the terminal distal of the module antenna.

Consequently, the invention provides for increasing the size of this triangle, on the one hand by transferring the connection terminal of the distal end of the antenna to the limit of the module encapsulation zone, and on the other hand part by spreading as far as possible the internal edges of the connection wells of the module contacts which are closest to the distal end of the antenna, for example the standardized contacts C1 and C5, or C3 and C7, or C5 and C7, depending on the positioning of the antenna offset.

In addition, the height of these connection wells can be reduced in the direction of the offset and they can be given an oblong shape.

Thanks to these measures, it will be possible to add several turns to the antenna, and therefore to increase the value of the inductance L of the antenna of the module, while substantially preserving the size of the tracks and the inter-track distances.

Furthermore, the invention provides that the internal track of the antenna of the module is provided with several proximal connection pads, constituting as many possible options for connection to the contactless interface of the microelectronic chip. Thanks to this measure, it will be possible to adapt the impedance L of the module antenna more finely to the effective capacitance C of the chip which will be used for manufacturing the module.

The invention therefore relates to an electronic module for a smart card, comprising a substrate having on a first face a terminal block of electrical contacts (C1, C2, C3, C5, C6, C7) standardized according to ISO 7816 allowing an operation by contact with the corresponding contacts of a smart card reader, and comprising on a second face an antenna and a microelectronic chip protected by an encapsulation zone and provided with a contact communication Interface and an Interface of contactless communication, the electrical contacts (C1-C7) being connected to the chip by conductive wires passing through connection wells, the antenna comprising a plurality of turns situated on the periphery of the module and a proximal connection pad and a distal connection pad arranged inside the encapsulation zone and intended to be connected to corresponding terminals of said contactless communication interface of the chip, and the turns of the antenna comprising a localized recess bypassing the distal connection pad and oriented towards the chip, characterized in that the distal connection pad is located at a small distance d from the edge of the encapsulation zone, and in that the internal edges of the connection wells of the two contacts closest to the distal connection pad are spaced outwards from the module relative to the internal edges of the connection wells of the other contacts, so as to maximize the space available between the distal connection pad and said connection wells for the passage of the antenna tracks.

In this way, the triangle formed by the distal connection pad and the connection wells closest to the distal connection pad is of maximum size and allows the passage of a larger number of antenna turns, and therefore leads to an increase in the Inductance L of the antenna.

According to an advantageous alternative embodiment of the module, the distance d between the edge of the encapsulation zone and the outer edge of the distal connection pad is between 0 and 500 micrometers.

According to an advantageous embodiment in particular for the small module (8.3×11 mm$^2$), the distance of spacing E1 between the internal edges of the connection wells closest to the distal connection pad has a value of about 6 millimeters.

According to an advantageous embodiment in particular for the small module (8.3×11 mm$^2$), the distance of spacing E2 between the external edges of the connection wells closest to the distal connection pad has a value of about 7 millimeters.

According to a preferred embodiment, the connection wells of the contacts located in the vicinity of the offset of the antenna are oblong in shape to facilitate the passage of the connection wires between the chip and said contacts. The width of these connection wells is then less than 600 micrometers.

According to an advantageous embodiment, the innermost turn of the antenna surrounds the localization of the microelectronic chip and comprises several proximal pads (A, B, C, D, E, F) distributed along the inner turn and corresponding to different antenna lengths and to different inductances, so that the antenna located between the distal stud and one of the proximal studs (A, B, C, D, E, F) has an inductance L suitable to be selected, when connected to the microelectronic chip and according to the capacitance C thereof, to obtain a target resonance frequency.

According to one embodiment, the Internal turn of the module antenna comprises at least six proximal connection pads.

Thanks to the invention, the inductance L of the antenna is included, depending on the connected proximal pad, between 1.3 and 1.45 micro Henry and allows to connect a chip whose capacity C is between 45 and 104 pico Farad, while obtaining the desired resonance frequency.

The invention also relates to a smart card with a dual contact and contactless communication interface, characterized in that it comprises an electronic module having the above features.

Other features and advantages of the invention will appear while reading the detailed description and the appended drawings in which.

DETAILED DESCRIPTION

Figure 1:
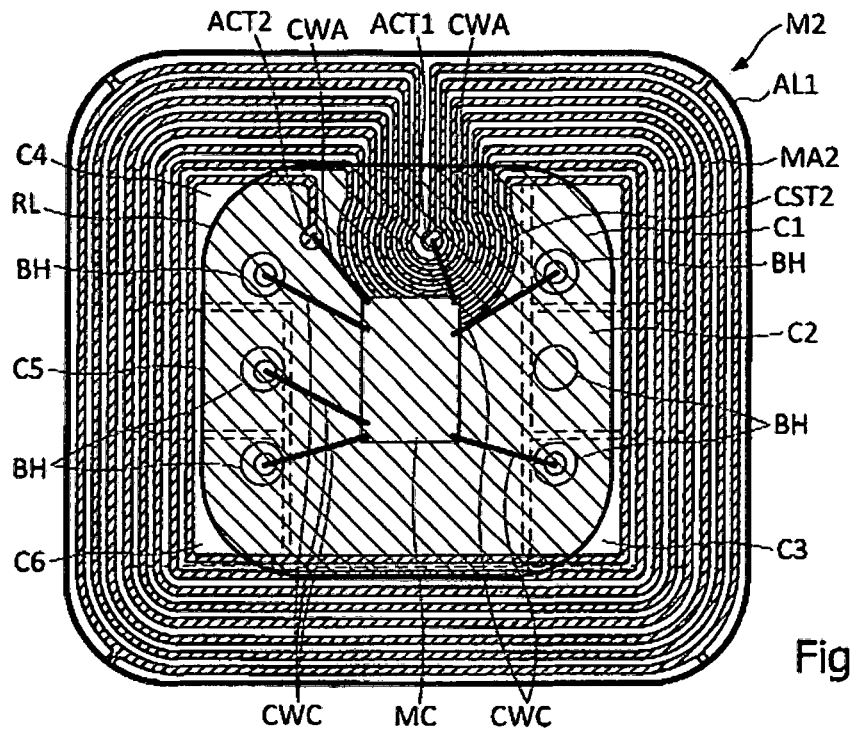
FIG. 1 is a plan view of an electronic module with a dual communication interface according to the state of the art.

FIG. 1 corresponds to FIG. 7 of document FR 12 01866 A1 describing an electronic module for a smart card conforming to the state of the art. The module M2 includes a set of 8 turns MA2, extending between the distal end, which is the end of the external turn, denoted ACT1, and the proximal end, which is the end of the internal turn, denoted ACT2. The turns have an offset in the direction of the microelectronic chip denoted MC, and passing through the triangle formed by the distal end ACT1 and the connection wells of the metal contacts referenced C1 and C4. The distal ACT1 and proximal ACT2 ends of the antenna are clearly inside the encapsulation zone denoted RL, which corresponds to a drop of resin protecting the chip and its connection pads. The access wells BH to the contacts are aligned in two vertical rows on either side of the chip, therefore the triangle formed by ACT1 and the two upper wells BH which are closest to ACT1 is of reduced size, which reduces the width available for the coil and is better suited to large modules. This results in a limit on the length of the antenna and therefore on its inductance. Furthermore, the inductance of the antenna of FIG. 1 is always fixed and does not allow to adapt to the capacity of different chips.

Figure 2:
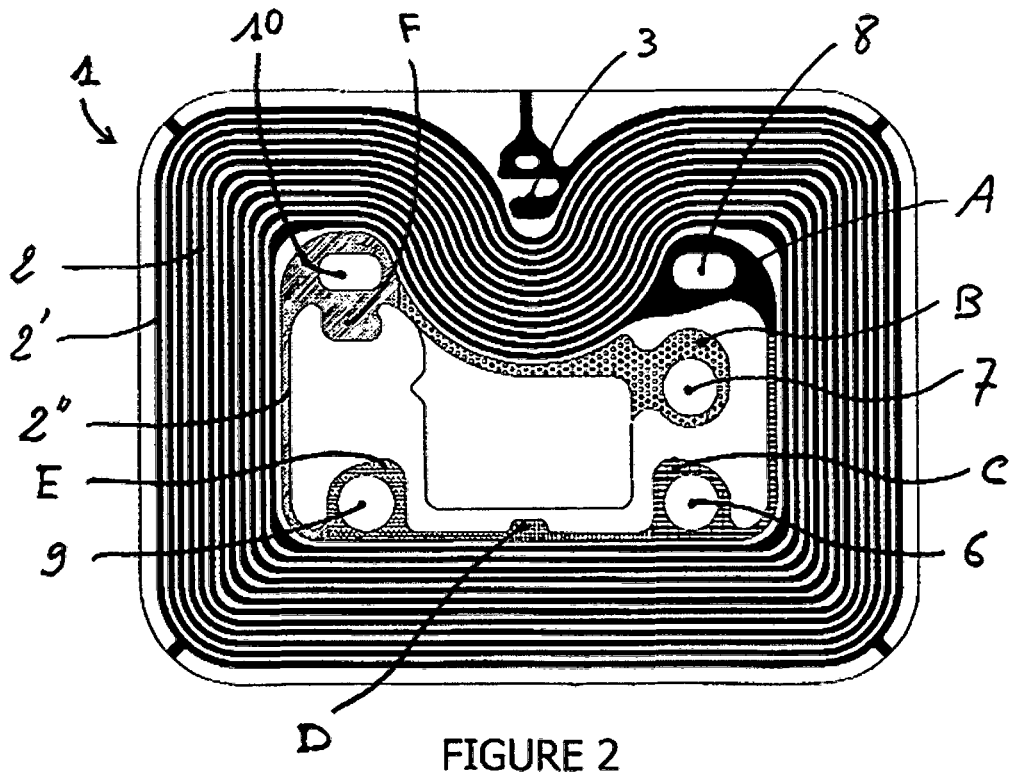
FIG. 2 is a plan view of the antenna for producing an electronic module according to the invention.

FIG. 2 shows the rear face (antenna side) of a module 1 for a smart card according to the invention. For clarity, only the metallizations corresponding to the antenna 2 have been shown here, without representing either the chip or the metal contacts of the terminal block. Although the invention is not limited to small modules (DUAL6), a small module has been shown here, namely a size of 8.3×11 mm2 corresponding to a standard size. Despite its small size, the antenna 2 has 13 turns, instead of 8 turns in FIG. 1. This makes it possible to at least partially compensate for the reduction in the inductance L of the antenna, due to the decrease in size of the module.

Figure 3A:
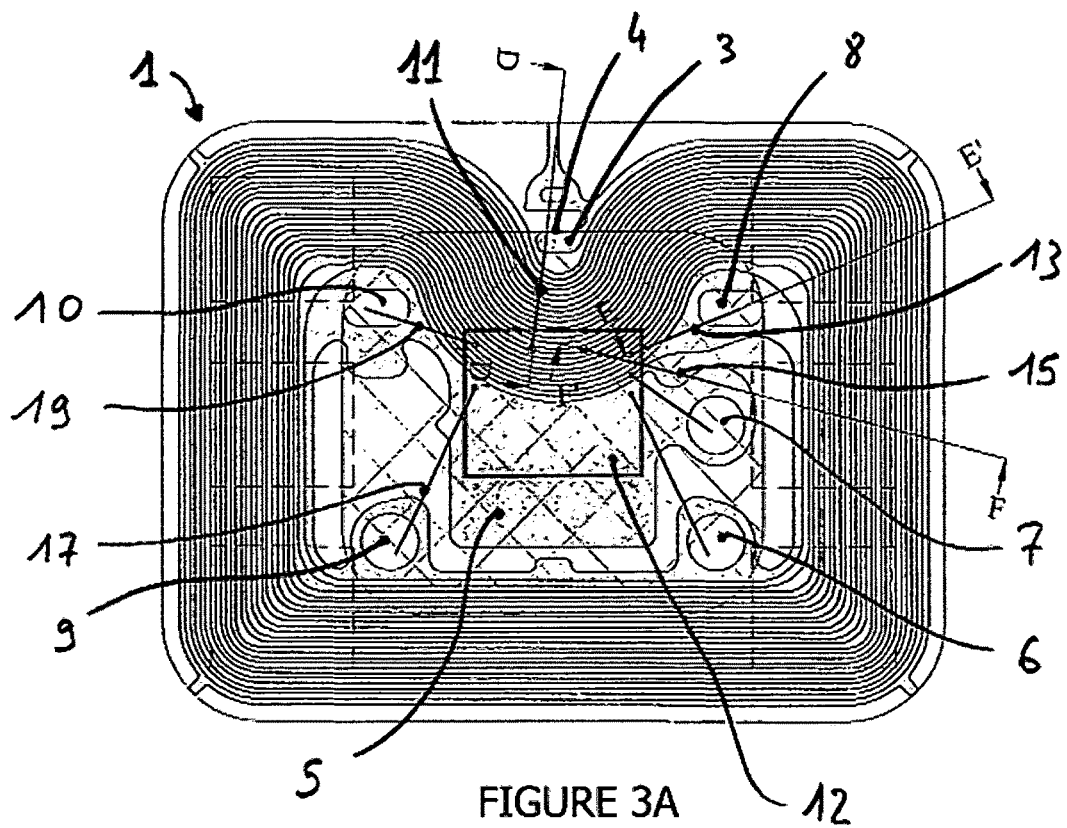
FIGS. 3A and 3B to 3D are respectively a plan view of the rear face (antenna side) and sectional views of an electronic module according to the invention, using the antenna of FIG. 2.

In order to obtain this result, the distal end 3 of the antenna has been transferred to the limit of the encapsulation zone 5 (FIG. 3A).

More specifically, the outer limit of the distal end 3 of the antenna 2 is Included at a distance d from the limit 4 of the encapsulation drop 5 between 0 and 500 micrometers.

Furthermore, in the example shown, the connection wells 6, 7, 8 of the chip with the contacts C1, C2, C3 and the connection wells 9, 10 of the chip with the contacts C5, C7 are no longer aligned in two vertical axes, but the connection wells 8, 10 corresponding to the contacts C1 and C5 have been moved apart and offset towards the external edges of the module, relative to the connection wells 6, 7, 9 of the standardized contacts C2, C3, C7.

Figure 4:
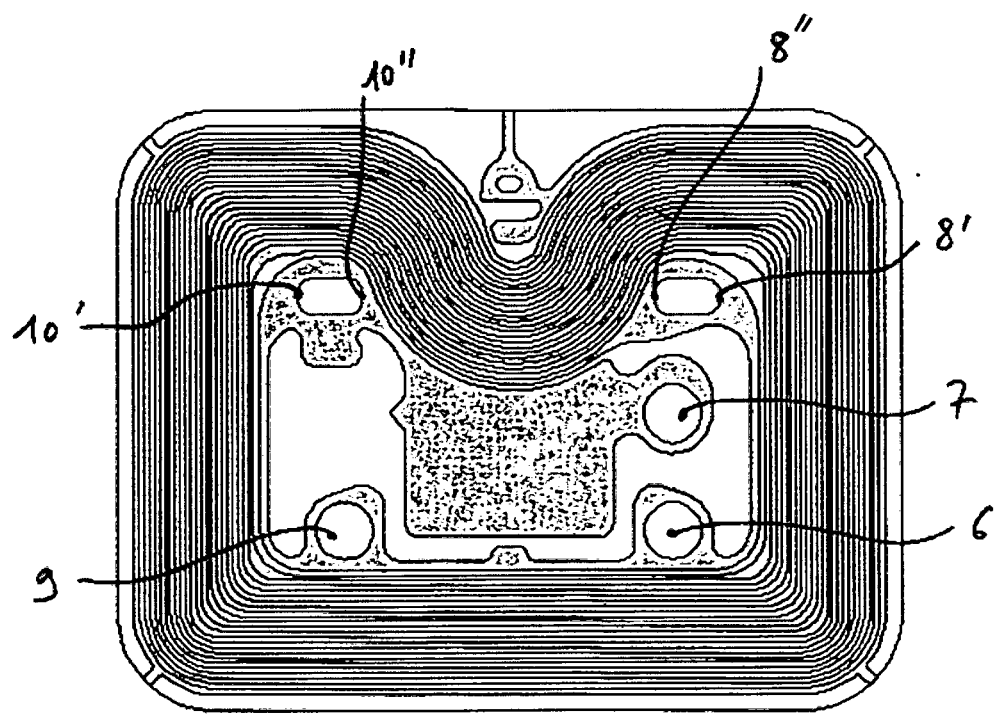
FIG. 4 is a plan view of the antenna similar to FIG. 3, showing construction details.
Figure 5:
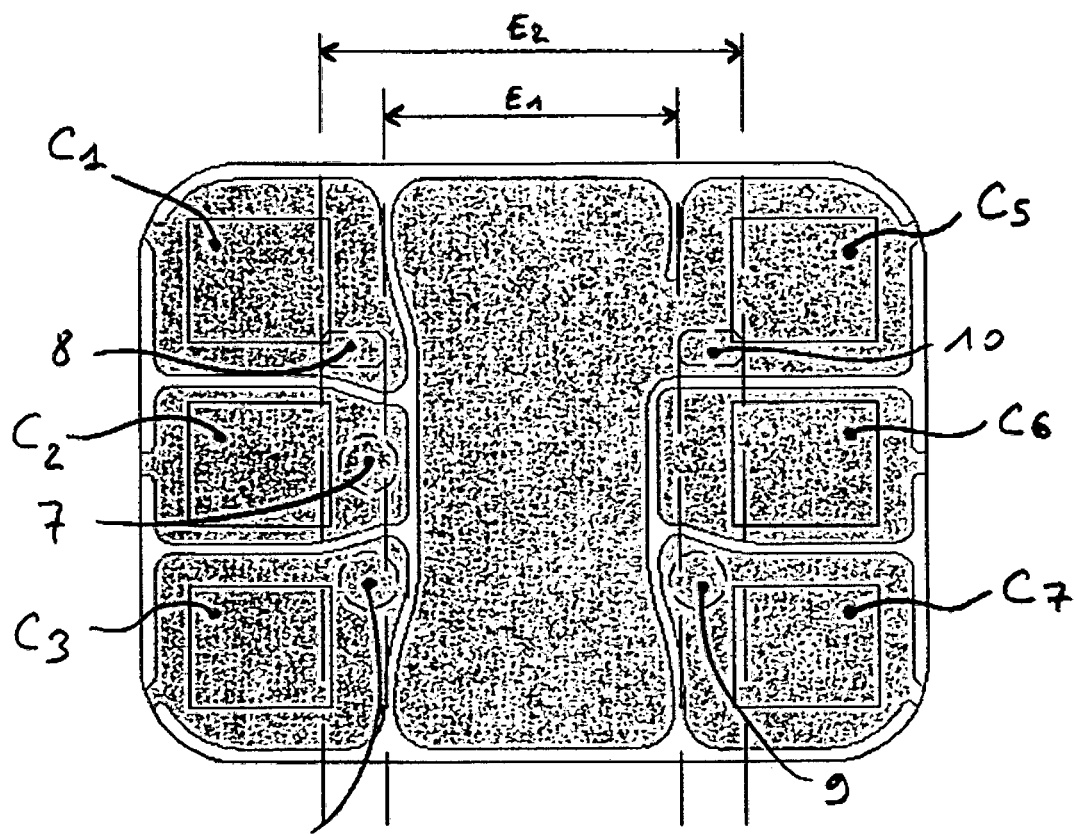
FIG. 5 is a plan view of the front face (facing contacts) of the module according to the invention.

More specifically, as shown in FIG. 4, the internal edges 8" and 10" of the connection wells 8, 10 which are closest to the distal end 3 of the antenna, have been slightly offset towards the outside, such that, as shown in FIG. 5, the value of the distance E1 between the internal edges 8", 10" goes from 4 mm in the known modules, to around 6 mm in the module according to the invention. As a result, it becomes possible to widen the layer of turns of the antenna 2.

In addition, the connection points of the wires 13, 19 in the connection wells 8, 10, (FIG. 3A) are also separated by a value of 400 to 500 micrometers on each side, to facilitate the connection of these wires without putting them in short-circuit with the metal of the antenna 2. This requires that the external edges 8' and 10' of the connection wells 8,10 be also separated to reach a distance E2 (FIG. 5) of approximately 7 mm, instead of 5 mm for known modules. The displacement towards the outside of the connection wells of the contacts C1, C5 makes it more difficult to land the connection wires 13, 19 coming from the chip 12 and going towards said wells. In order to compensate for this difficulty, the Invention provides for giving the connection wells 8, 10 of the contacts C1, C5 an oblong shape with a flattening along the axis of the offset 20 of the antenna 2, such that the connection wires can be connected without touching the metallization of the internal coil 2' of the antenna. The width of the connection wells 8, 10 is then preferably less than 600 micrometers.

It should be noted that in the example shown, the distal end 3 of the antenna 2 is located near the standardized contacts C1, C5, but the principles of the invention could easily be transposed to other cases, for example with the distal end positioned between contacts C5 and C7, or between contacts C3 and C7.

In order to best adapt the value of the impedance L of the antenna of the module to the capacitance C of the chip to obtain a target resonant frequency, a preferred embodiment of the invention provides that the internal coil 2" of the antenna has a plurality of proximal connection pads, as shown in FIG. 2. In this figure, 6 connection pads A, B, C, D, E and F are provided, distributed along the internal coil 2" and corresponding to Increasing values of the antenna impedance. Therefore it is possible to choose the most appropriate connection range depending on the capacity of the chip that will actually be used in a given module.

FIG. 3A represents an electronic module according to the invention, seen from the lower side, that is to say from the side showing the antenna 2, the chip 12, and the wires 11, 13, 15, 17, 19 for the connection between the chip and the antenna or the contacts through the connection wells (also called "bonding" wells in English terminology). The part of the metal zones corresponding to the C1-C7 contacts regulated by the ISO 7816-2 and 7816-3 standard is shown in dashed lines. The encapsulation drop 5 of the chip is shown in hatched pattern. As can be seen, the distal end 3 of the antenna 2 is positioned in the encapsulation zone 5, at the limit 4 of the latter.

Figure 3B:
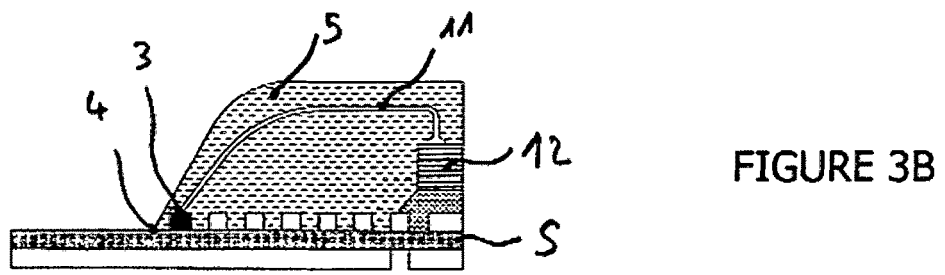

FIG. 3B corresponds to a partial sectional view of the module 1 along the cutting plane DD, showing the connection wire 11 between the chip 12 and the distal end 3 of the antenna, positioned at the periphery 4 of the drop d encapsulation 5.

Figure 3C:
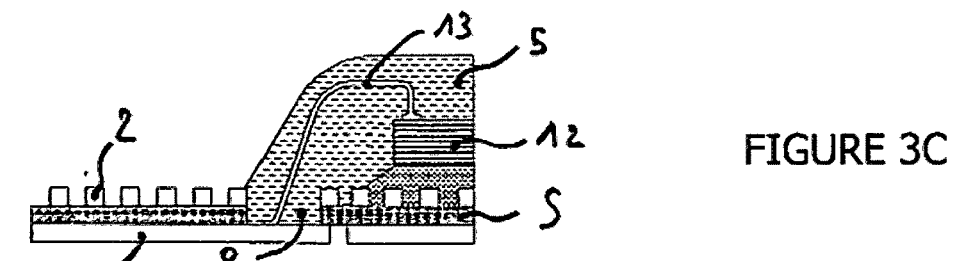

FIG. 3C corresponds to a partial sectional view of the module 1 along the section plane E-E, showing the connection wire 13 between the chip 2 and the contact C1 of the module.

Figure 3D:
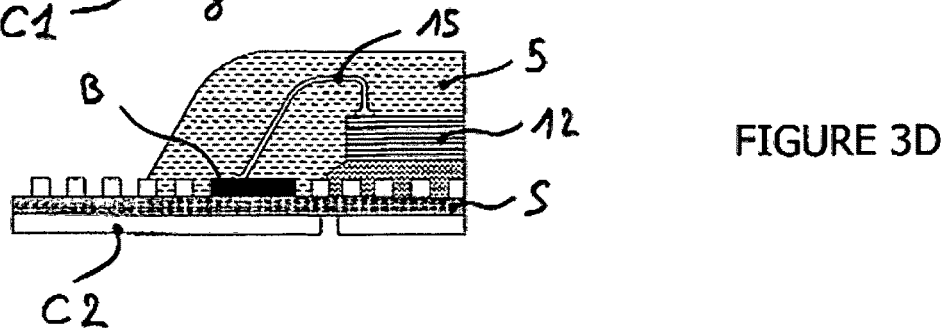
Figure 6A:
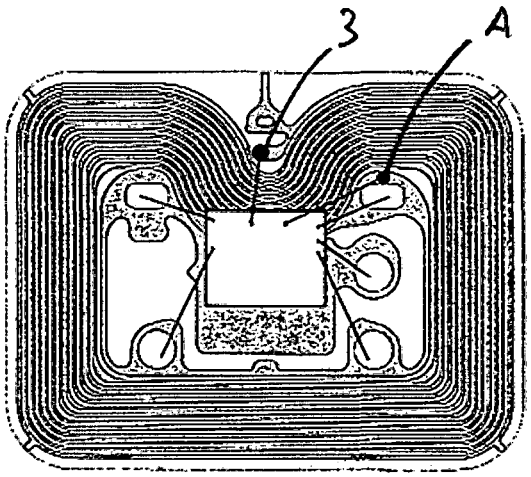
FIGS. 6A to 6F are plan views of the rear face of the electronic module according to the invention, in different wiring configurations.
Figure 6B:
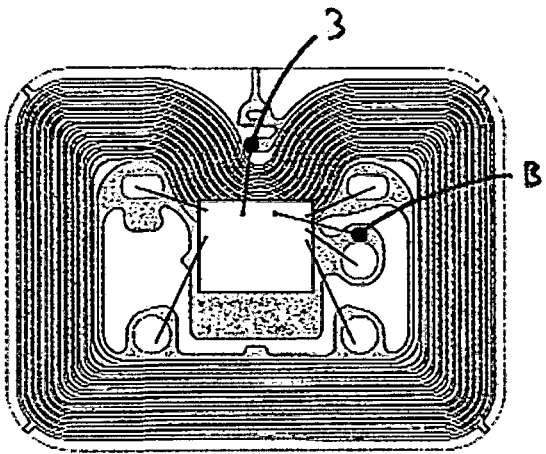
Figure 6C:
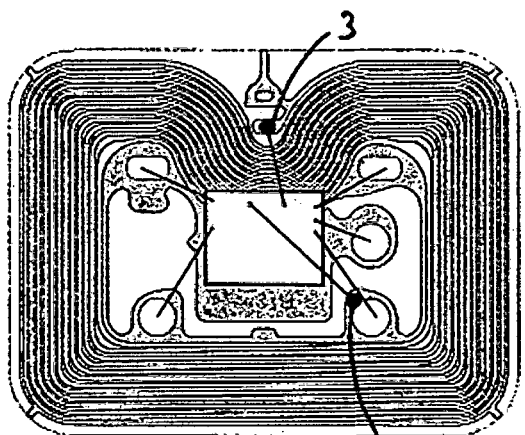
Figure 6D:
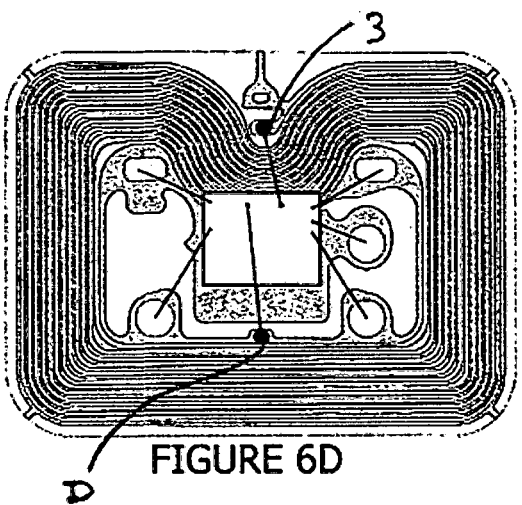
Figure 6E:
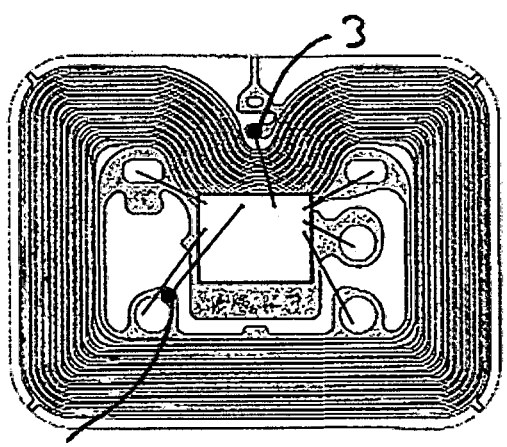
Figure 6F:
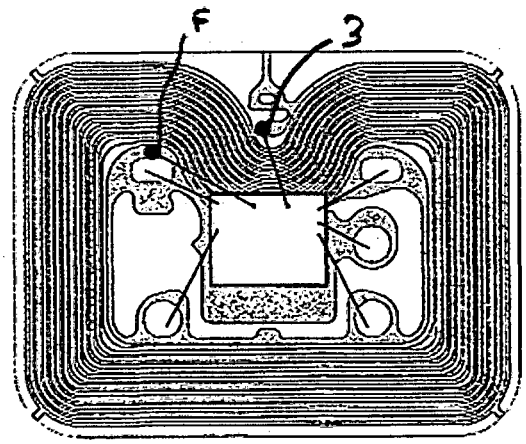

FIG. 3D corresponds to a partial sectional view of the module 1 along the section plane F-F, showing the connection wire 15 between the chip 2 and one of the proximal connections B of the antenna. The different connection options of the antenna 2 have been shown diagrammatically in FIG. 6. In all cases a terminal of the contactless communication interface of the chip 2 is connected to the distal end 3 of the antenna, and its other terminal is connected to one of the proximal pads A (FIG. 6A), B (FIG. 6B), C (FIG. 6C), D (FIG. 6D), E (FIG. 6E) or F (FIG. 6F) available on the antenna, corresponding to increasing values of the inductance L of the antenna 2. It has been observed in practice that this arrangement makes it possible to use the same antenna, with chips having capacitances C varying between values between approximately 45 pF and approximately 104 pF, corresponding to most of the chips for smart cards commonly available.

Advantages of the Invention

Overall, the invention achieves the goals set. It proposes a design of an electronic module for a smart card with a dual communication interface allowing the integration of a larger antenna on a module of reduced size.

In addition, thanks to the different antenna connection options, it makes it possible to optimize the resonance frequency of the modules according to the different capacitance values of the microelectronic chips on the market, typically varying between 45 and 104 pF.

These advantages are obtained without jeopardizing previous advances, such as the integration of the ends of the antenna of the module inside the encapsulation zone of the chip.

The invention claimed is:

1. Electronic module for a smart card, comprising a substrate having on a first face a terminal block of electrical contacts standardized according to ISO 7816 allowing operation by contact with the corresponding contacts of a smart card reader, and having on a second face an antenna and a microelectronic chip protected by an encapsulation zone and provided with a contact communication and a contactless communication interface, the electrical contacts being connected to the chip by conductive wires passing through connection wells, the antenna comprising a plurality of turns located on the periphery of the module and a proximal connection pad and a distal connection pad arranged inside the encapsulation zone and connected to corresponding terminals of said contactless communication interface of the chip, and the turns of the antenna comprising a localized recess bypassing the distal connection pad and oriented towards the chip, wherein the distance d between the edge of the encapsulation zone and the outer edge of the distal connection pad is between 0 and 500 micrometers.

2. Electronic module according to claim 1, wherein the spacing distance between the internal edges of the connection wells of the two contacts closest to the distal connection pad has a value of about 6 millimeters.

3. Electronic module according to claim 1, wherein the spacing distance between the outer edges of the connection wells closest to the distal connection pad has a value of about 7 millimeters.

4. Electronic module according to claim 1, wherein the connection wells of the contacts located in the vicinity of the recess of the antenna are oblong to facilitate the passage of the connection wires between the chip and said contacts.

5. Electronic module according to claim 4, wherein the width of the connection wells located in the vicinity of the recess of the antenna is less than 600 micrometers.

6. Electronic module according to claim 1, wherein the most internal turn of the antenna surrounds the area of the microelectronic chip and comprises several proximal studs distributed along the internal coil and corresponding to different antenna lengths and different inductances, so that the antenna located between the distal pad and one of the proximal pads has an inductance L capable of being selected, when it is connected to the microelectronic chip and according to the capacity C thereof, to obtain a target resonance frequency.

7. Electronic module according to claim 6, wherein the internal turn of the antenna of the module comprises at least six proximal connection pads.

8. Electronic module according to claim 6, wherein the inductance L is between 1.3 and 1.45 micro Henry and that the capacitance C of the chip is between 45 and 104 pico Farad.

9. Smart card with a dual contact and contactless communication interfaces, comprising an electronic module according to claim 1.

10. Smart card with a dual contact and contactless communication interfaces, comprising an electronic module according to claim 9.

11. Electronic module for a smart card, comprising a substrate having on a first face a terminal block of electrical contacts standardized according to ISO 7816 allowing operation by contact with the corresponding contacts of a smart card reader, and comprising on a second face an antenna and a microelectronic chip protected by an encapsulation zone and provided with a contact communication and a contactless communication interface, the electrical contacts being connected to the chip by conductive wires passing through connection wells, the antenna comprising a plurality of turns located on the periphery of the module and a proximal connection pad and a distal connection pad arranged inside the encapsulation zone and connected to corresponding terminals of said contactless communication interface of the chip, and the turns of the antenna comprising a localized recess bypassing the distal connection pad and oriented towards the chip, wherein the internal edges of the connection wells of the two contacts closest to the distal connection pad spread further outwards from a centerline of the module passing through the distal connection pad and the chip than the internal edges of the connection wells of the other contacts.

12. Electronic module according to claim 11, wherein the distanced between the edge of the encapsulation zone and the outer edge of the distal connection pad is between 0 and 500 micrometers.

13. Electronic module according to claim 11, wherein the spacing distance between the internal edges of the connection wells of the two contacts closest to the distal connection pad has a value of about 6 millimeters.

14. Electronic module according to claim 11, wherein the spacing distance between the outer edges of the connection wells closest to the distal connection pad has a value of about 7 millimeters.

15. Electronic module according to claim 11, wherein the connection wells of the contacts located in the vicinity of the recess of the antenna are oblong to facilitate the passage of the connection wires between the chip and said contacts.

16. Electronic module according to claim 15, wherein the width of the connection wells located in the vicinity of the recess of the antenna is less than 600 micrometers.

17. Electronic module according to claim 11, wherein the most internal turn of the antenna surrounds the area of the microelectronic chip and comprises several proximal studs distributed along the internal coil and corresponding to different antenna lengths and different inductances, so that the antenna located between the distal pad and one of the proximal pads has an inductance L capable of being selected, when it is connected to the microelectronic chip and according to the capacity C thereof, to obtain a target resonance frequency.

18. Electronic module according to claim 17, wherein the internal turn of the antenna of the module comprises at least six proximal connection pads.

19. Electronic module according to claim 17, wherein the inductance Lis between 1.3 and 1.45 micro Henry and that the capacitance C of the chip is between 45 and 104 pico Farad.

* * * * *